United States Patent [19]

Grimes

[11] Patent Number: 4,803,658
[45] Date of Patent: Feb. 7, 1989

[54] CROSS TIE RANDOM ACCESS MEMORY

[75] Inventor: Elizabeth H. Grimes, Ellicott City, Md.

[73] Assignee: Westinghouse Electric Corp., Pittsburgh, Pa.

[21] Appl. No.: 3,536

[22] Filed: Jan. 15, 1987

[51] Int. Cl.$^4$ .............................................. G11C 11/14
[52] U.S. Cl. ........................................ 365/87; 365/170
[58] Field of Search .............................. 365/87, 9, 170

[56] References Cited

U.S. PATENT DOCUMENTS

| | | | |
|---|---|---|---|
| 3,868,659 | 2/1975 | Schwee | 365/87 |
| 4,246,647 | 1/1981 | Johnson et al. | 365/87 |
| 4,473,893 | 9/1984 | Zierhut et al. | 365/87 |
| 4,722,073 | 1/1988 | Lampe et al. | 365/87 |

OTHER PUBLICATIONS

IBM Technical Disclosure Bulletin–vol. 17, No. 10 Mar. 1975; pp. 3074–3075.

*Primary Examiner*—James W. Moffitt
*Attorney, Agent, or Firm*—W. G. Sutcliff

[57] ABSTRACT

A cross tie random access memory has spaced binary memory elements of thin film magneto-resistive material. A source, drain, and channel under each memory element forms a transistor with the thin film memory element which acts as the gate of the transistor. Circuitry is provided to write in and read out a data bit in the addressed binary memory element by providing current under only the memory element being addressed.

8 Claims, 4 Drawing Sheets

CROSS TIE RANDOM ACCESS MEMORY

BACKGROUND OF THE INVENTION

1. The present invention relates to magnetic memory cells used to store digital electronic data and, more particularly, to an improved magnetic memory cell which functions as a random access memory.

2. Description Of Related Art

The dipole magnetic moments of neighboring atoms within a small region, or domain, of a thin film of magnetic material align themselves when placed in a sufficiently strong external magnetic field. This alignment of magnetic dipole moments is unique to magnetic materials (such as Fe, Co, Ni, Gd and Dy) and takes place despite the random motion generally undergone by atoms within any material. The orientation of the magnetic dipole moments remains after the external magnetic field is removed.

Transition regions exist between any two domains which do not have the same alignment of magnetic dipoles. The transition regions between such domains are called domain walls. Different types of domain walls typically exist in magnetic material, each unique with respect to the orientation of the magnetic field existing within or comprising the domain wall. Three types of domain walls are Nél walls, cross ties, and Bloch lines or walls. Within a Nél wall the magnetic field rotates in the plane of the thin film, and the Nél wall separates two antiparallel domains in the film. Reversing the magnetic field direction in a small portion of a Nél wall results in the creation of a cross tie. The cross tie magnetization generally opposes the magnetization in the domains separated by the Nél wall. Within a Bloch line the magnetic field rotates out of the plane of the thin film. The magnetization associated with a Bloch line generally parallels the magnetization in the domains separated by the Nél wall.

As briefly discussed above, associated with each cross tie is a section of the Nél wall that is reversed or inverted. That portion of the Nél wall is often referred to as a negative Nél wall with the non-inverted Nél wall being referred to as the positive, stable, or dominant Nél wall. The negative Nél wall section is bordered by a cross tie on one end and a Bloch line on the other end.

The characteristic magnetic fields of the domain wall types remain unchanged in the absence of an external magnetic field of a predetermined strength. In the presence of an external field of the predetermined strength, however, the magnetic state of a domain wall, or domain state, at any given location in the thin film can be changed.

The stable magnetic domain states of the magnetic film represented by the domain wall magnetization fields may be utilized within a memory system for the storage of digital data. Such a memory system is referred to as a "cross tie" memory. In a binary cross tie memory system the stable Nél wall and the alternative stable reversed Nél wall with a cross tie and Bloch line pair can be used to represent bits of data. The data can be written into memory by the application of an appropriate magnetic field Where a positive Nél wall exists, a cross tie/Bloch line pair can be introduced by the application of the appropriate magnetic field and will represent a specific logic state (i.e., logic "1" or a logic "0"). An opposite field can be used to annihilate the cross tie and, thus, restore the original Nél wall domain state. That stable state will represent the opposite logic state (i.e., a logic "0"0 or a logic "1"). For the purpose of this description, a logic "1" will be represented by the presence of a cross tie, and a logic "0" is the presence of only a positive Nél wall.

The data can also be read from the magnetic memory. The read-out may be accomplished by the use of magneto-resistive effects The introduction of small magnetic fields into the domain walls of the magnetic film changes the resistance within the film. That resistance change can be measured and varies according to the domain state of the magnetic film. The resistance change is small if the domain state is a Nél wall, and the resistance change is larger if the cross tie state exists. A measurement of the resistance reveals the state of the domain wall and, thus, the logic state which represents a digit or bit of stored data. The precise amount of the resistance measured in each state and the measured resistance change differs according to which cross tie memory system is being practiced.

Reading and writing of individual domains within the magnetic film of such a system is accomplished by means of conductors aligned over positioned domain walls. The currents through the conductors create the small and larger magnetic fields which allow the magneto-resistive reading and the writing of data, respectively.

U.S. Pat. No. 3,868,659, issued on Feb. 25, 1975 to Schwee, discusses the use of thin film magnetic materials as data storage devices. A more recent disclosure of such use of thin film magnetic materials is contained in U.S. Pat. No. 4,246,647, which issued on Jan. 20, 1981 to Johnson et al. In both of those patents, the memory disclosed is a serial memory, i.e., once a data bit is entered at one end of the memory, it is passed through the memory and cannot be removed until all data entered ahead of it has been removed. The operation of such a memory is described in the above-referenced patents. Those serial memories have obvious limitations in that it is often desirable to randomly access data which has been stored in the memory. In a serial access memory, to access a given data bit, it is necessary to first read out all data which was entered before the data bit of interest can be read.

To overcome the problems and disadvantages of the prior art serial access memories, random access magnetic thin film memory systems have been proposed within which each memory element can be randomly accessed to either read or change the data bit stored in it. One such thin film random access memory ("RAM") is described in U.S. patent application Ser. No. 933,516 filed Nov. 21, 1986, in the name of John F. Jackson, and assigned to the assignee of this invention. Another thin film RAM is described in U.S. patent application Ser. No. 933,709, filed Nov. 21, 1986 in the name of Elizabeth H. Ginnes and Charles W. Baugh and also assigned to the assignee of this invention.

A portion of one cross tie random access memory is shown in FIG. 1. Cross tie random access memory 5 includes substrate 6 with strips 7, 8 of thin film magneto-resistive material. Spaced memory elements 9, 10, 11, 12 are contained in the thin film in an array. Memory elements 9, 10, and 11, 12 disposed on thin film strips 7, 8, respectively, may be pictured as comprising vertical columns $m_1$, $m_2$ of spaced memory locations. Similarly, memory elements 9, 11 or 10, 12 may be seen as forming horizontal rows $n_1$, $n_2$ of spaced memory locations.

Metallic row conductors 13 and 14 overlay memory elements 9, 11, and 10, 12 respectively; while column conductors 15 and 16 overlay memory elements 9, 10 and 11, 12 respectively. Write module 17 is connected to both row conductors 13, 14 and column conductors 15, 16. Read module 18 is connected to row conductors 13, 14 and to thin film strips 7, 8.

In operation, the individual memory elements are initialized, or aligned, by placing a sufficiently large magnetic field perpendicular to the columns of memory elements. The field initially aligns the magnetic moments in the thin film and creates a positive Nél wall in each memory element 9, 10, 11, 12. After initialization, data can then be written into RAM 5 of FIG. 1 as follows. First, the process circuitry of the memory system determines that a data bit should be placed in a specific memory element. For writing in a data bit, write module 17 then generates a potential of predetermined value and polarity which is applied to both the row conductor and column conductor connected to the selected or addressed memory element to change its and only its magnetic state. The memory element written into is that location where both the overlaying column and row conductor have been supplied with the potential of predetermined value. For example, if a data bit is to be written into memory element 9, write module 17 will generate a sufficient potential on selected row conductor 13 and selected column conductor 15. The current through the selected row conductor must be insufficient by itself to generate a magnetic field strong enough to change the magnetic state of any of the memory elements in the row (e.g., elements 9 and 11). Similarly, the current through the selected column conductor must be insufficient by itself to change the magnetic state of the memory elements in the column (e.g., elements 9 and 10). Thus, in the memory elements where both the overlying row and column conductors of RAM 5 have not been coincidently supplied with current (i.e., the unaddressed memory elements) no stable magnetic state should change. However, the addressed memory element is subject to the magnetic fields generated by both the selected row conductor and the selected column conductor. There the magnetic field is large enough to change the magnetic state of that addressed memory element and, thus, the data bit is written in as desired. By changing the polarity of the potential applied to the selected row and column, the direction of the currents in the selected conductors can be changed and the generated magnetic fields reversed to write either a logic "1" or a logic "0" into the addressed memory element.

To read out a data bit from an addressed memory element, read module 18 generates a potential having a predetermined value and polarity which is applied to a row conductor 13 or 14 in which the addressed memory element is located. The applied potential generates a current which, in turn, generates a magnetic field in the selected row. The field places the addressed memory in a condition of changed resistance. The generated magnetic field, although sufficient to change the resistance of the memory elements, must be small enough not to cause a change in the stable magnetic states of any of the memory elements.

The resistance change undergone by a memory element depends on the magnetic state of the element. The different resistance changes permit a distinction between the stored states at different memory element locations and, therefore, allows the data bit stored in a memory element to be read. For example, if a data bit is to be read from memory element 9 of RAM 5 in FIG. 1, read module 18 will select row conductor 13 and thin film strip 7, will apply the necessary potential to row conductor 13, and will sense the current change in strip 7 which indicates the change in resistance of addressed memory element 9. The resistance change is determined by using conventional sensing techniques.

In the above described cross tie RAMs, current flows past, and thus magnetic fields are generated near, not only the addressed memory element but also other memory elements in the array. For example, if memory element 9 is the element addressed for the writing in of a data bit, current flows through both row conductor 13 and column conductor 15. Thus, not only are magnetic fields generated at addressed element 9 as desired but also a magnetic field is generated at unselected memory element 11 due to the current in row conductor 13 and at unselected memory element 10 due to the current in column conductor 15.

Similarly, in the read mode, current flows past, and thus magnetic fields are generated near, not only the addressed memory element but also other memory elements in the row in which the addressed memory element is located.

Such a situation places design restrictions on the operating margins of the memory. Specifically, the magnitude of the current that can be used in conductors must be carefully selected and controlled. Since each memory element may have a different threshold level at which it will change its stable magnetic state, the current in the rows and conductors must be at least half as small as the smallest threshold switching current of the most sensitive memory element in the array. Otherwise, the stable magnetic state of unaddressed memory elements may be changed unintentionally, thus, causing data bit errors in the cross tie RAM.

The use of coincident currents to write a data bit into an addressed memory element causes potential unacceptable bit errors in another manner. The generation of magnetic fields at the unselected memory elements, makes those memory elements much more susceptible to undesired stable magnetic state switching, such as from the influences of magnetic fields external to the memory system.

As can be seen from the above discussion, cross tie RAMs in which the reading and writing of data is accomplished in such a manner that magnetic fields are generated in unaddressed memory elements as well as in the addressed memory element, there is a potential for unacceptable bit error. Thus, from the foregoing consideration, it should be apparent that there is a great need for an improved cross tie RAM in which the problem of unacceptable bit error is alleviated.

It is, thus, intended that the invention provide a magnetic thin film random access memory system in which there is less chance for data bit error.

Another intent is that the invention provide a magnetic thin film random access memory system in which the reading in and writing out of data is accomplished by current flowing only under the one memory location which is being addressed.

Still another intent is that the invention provide a magnetic thin film random access memory system in which a large current may be used to write a bit into an addressed memory element without affecting the other memory elements of the memory array.

Yet another intent is that the invention provide a magnetic thin film random access memory system in which the effects of ambient electromagnetic fields is minimized.

A further intent is that the invention provide a magnetic thin film random access memory having high operating speed and high density, is non-volatile, and is operable over a wide operating temperature range.

Other intentions and features of the invention will further become apparent with reference to the accompanying drawings and the detailed description of the invention or may be learned by practice of the invention.

SUMMARY OF THE INVENTION

To achieve the foregoing intentions and in accordance with the purpose of the invention, as embodied and broadly described herein, a cross tie random access memory has spaced binary memory elements of thin film magneto-resistive material. The source, drain, and channel under each memory element forms a transistor with the memory element acting as the gate of the transistor. In a preferred embodiment, the transistor is an enhancement type MOSFET. The cross tie RAM has means for addressing selected ones of the memory elements and means for applying a WRITE voltage across the source and the drain under an addressed one of the elements to create a write current of magnitude and direction in the channel under the addressed memory element sufficient to change the binary memory state of the addressed memory element. The cross tie RAM also includes means for applying a READ voltage across the source and the drain under the addressed memory element to create a read current in the channel under that addressed memory element insufficient to change the memory state of the addressed memory element and sufficient to generate a Hall voltage in the channel under the addressed memory element at times when the element is in one of its binary memory states. Means are provided for sensing the presence and absence of a generated Hall voltage in the channel under the addressed memory element to determine the binary memory state of that element.

The means for addressing selected ones of the memory elements can include means for applying an ON voltage to a column conductor in which the addressed memory element is located sufficient to place the channel under the addressed memory element in its conductive state.

BRIEF DESCRIPTION OF THE DRAWINGS

The accompanying drawings, which are incorporated in and constitute part of the specification, illustrate embodiments of the invention and, together with the description, serve to explain the principles of the invention.

Of the drawings.

Reference will now be made in detail to the present preferred embodiments of the invention, examples of which are illustrated in the accompanying drawings.

DESCRIPTION OF THE PREFERRED EMBODIMENTS

Figure 1:
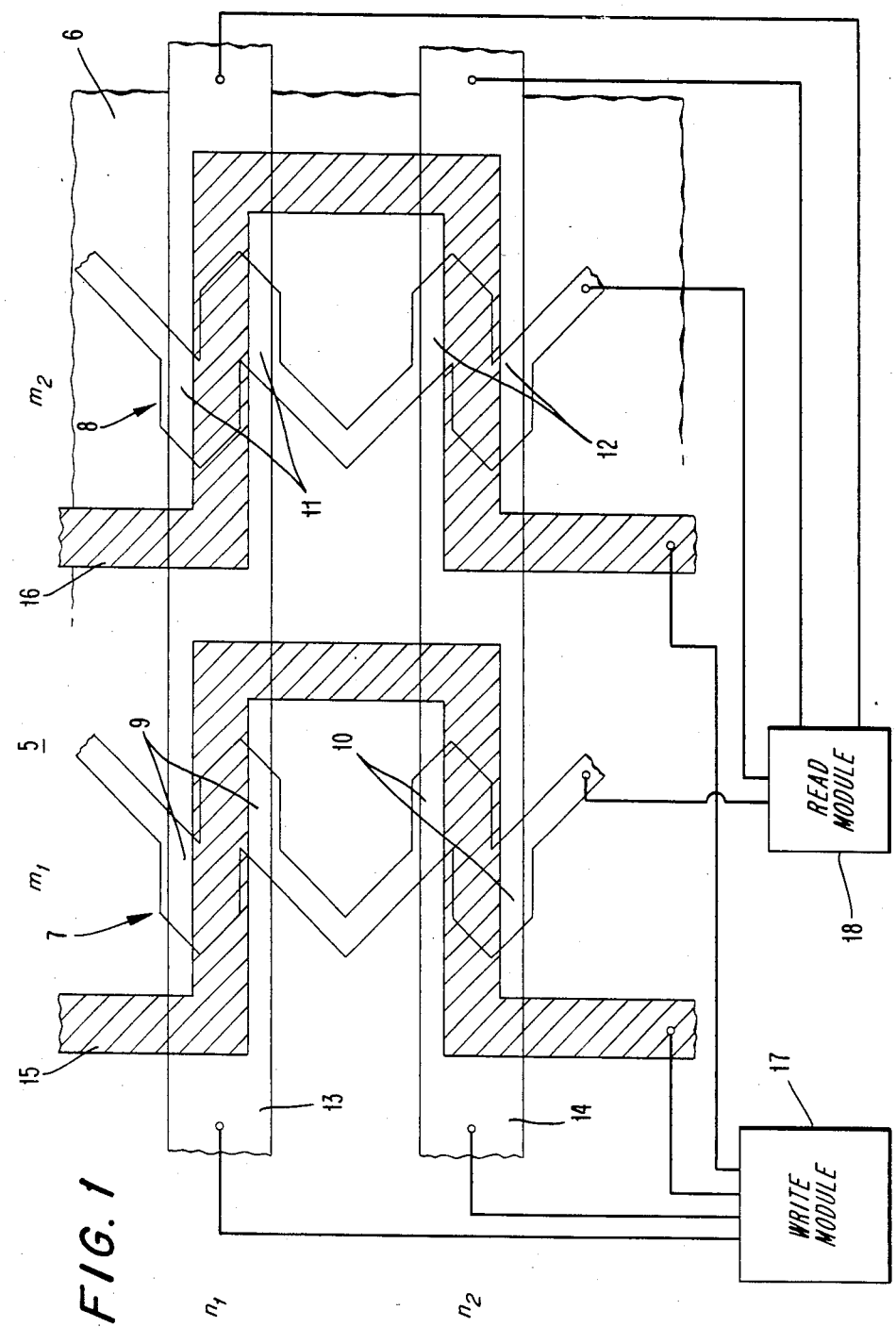
FIG. 1 is an enlarged diagrammatic view of a portion of a cross tie random access memory system to illustrate a proposed arrangement for applying read and write potentials thereto.
Figure 2:
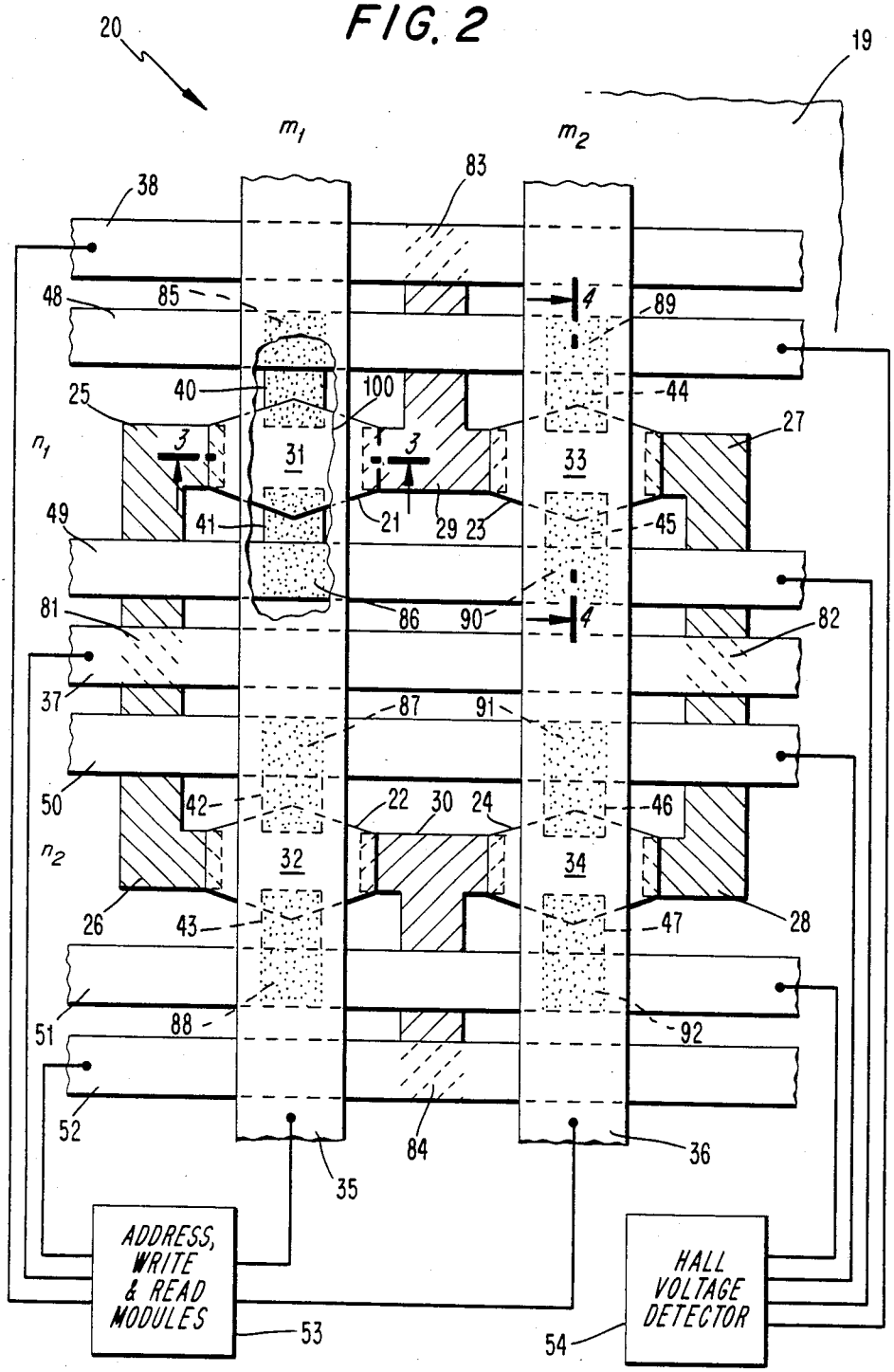
FIG. 2 is an enlarged diagrammatic view of a portion of a cross tie random access memory according to one preferred embodiment of the invention. A portion of column conductor 35 has been removed to show various details of the invention.

Referring now to the drawings, wherein like reference characters designate like or corresponding parts throughout the several drawings, there is shown in FIG. 2 cross tie random access memory 20, one preferred embodiment of the invention. In the cross tie RAM are spaced binary memory elements 21, 22, 23, 24 of thin film magneto-resistive material. A source, drain, and channel is under each memory element forming a transistor with the memory element acting as the gate of the transistor. Specifically, source 25, drain 29, channel 31 and memory element/gate 21 forms a transistor; and source 26, drain 30, channel 32, and memory element/gate 22 form another transistor. Similarly, source 27, drain 29, channel 33, and memory element/gate 23 form another transistor, and source 28, drain 30, channel 34, and memory element/gate 24 form a fourth transistor. Preferably, the transistors are enhancement type MOSFETs.

Spaced binary elements 21, 22, 23, 24 are used for storing data bits as described earlier and can be arranged in an array of rows $n_1$, $n_2$, and columns $m_1$, $m_2$. However, of course, the invention is not limited to such a configuration. Furthermore, while only four memory elements are shown, the number of memory elements can be any number desired. Additionally, the memory elements shown in FIG. 2 are illustrated as lozenge shaped; however, they are not restricted to that shape and can be adjusted by a person of ordinary skill in the art to create the optimum magnetic domain configuration for data storage. Furthermore, data bits may be represented by the presence or absence of a cross tie/Bloch line pair as described above or by the position of one or more Bloch lines or by any other bi-stable state in the thin film. The memory element configuration should be such that the state can be changed by application of a magnetic field in one direction (including its antiparallel direction) as discussed above.

A column conductor is operatively connected to each memory element in a column. For example, column conductor 35 in column $m_1$ is operatively connected to memory elements 21, 22 in FIG. 2 and other memory elements in that column which elements are not illustrated in FIG. 2. Similarly, column conductor 36 is operatively connected to memory elements 23, 24 in column $m_2$. In FIG. 2, a section 100 of column conductor 35 over memory element 21 has been removed to show various details of RAM 20 located under the column conductor.

A source row conductor is operatively connected to each of the sources under the memory elements in a given row. For example, row conductor 37 is operatively connected to source 25 of memory element 21 and source 27 of memory element 23 in row $n_1$. As illustrated in FIG. 2, row conductor 37 is also operatively connected to source 26 of memory element 22 and source 28 of memory element 24 in row $n_2$.

Also shown in FIG. 2, cross tie RAM 20 has a drain row conductor operatively connected to each of the drains under the memory elements in a given row.

Drain row conductor 38 is connected to drain 29 under memory elements 21 and 23 in row $n_1$. Similarly, drain row conductor 52 is operatively connected to drain 30 under memory elements 22 and 24 of row $n_2$.

In cross tie RAM 20, means are provided for individually addressing each of memory elements, for example, elements 21, 22, 23, 24 shown in FIG. 2. The addressing means include means for applying an ON voltage to the column conductor in which the addressed memory element is located sufficient to place the channel under the addressed memory element in its conductive state. The addressing means also includes means for applying a selected voltage across the source row conductor and the drain row conductor of the row in which the addressed memory element is located. For example, if it is desired to address memory element 22 in cross tie RAM 20, an ON voltage is applied to column conductor 35 by conventional processing circuitry. Where the transistor formed by source 26, drain 30, channel 32, and memory element/gate 22 is an enhancement type MOSFET, then the ON voltage, sufficient to place the channel under addressed memory element 22 in its conductive state, will be a gate voltage greater than the threshold voltage necessary to turn the MOSFET "on". To complete the selection of memory element 22 as the addressed memory element, source row conductor 37 and drain row conductor 52 are, by conventional processing circuitry, selected since those two row conductors select row $n_1$ in which address memory element 22 is located. If memory element 21 is to be addressed, the ON voltage is applied to column conductor 35 and row conductors 37 and 38 are utilized for applying a selected voltage across channel 31 via source 25 and drain 29 under memory element 21. The conventional processing circuitry for addressing a selected memory element is shown in FIG. 2 as part of address, write and read modules 53.

By removing the ON voltage from column conductor 35 and applying an ON voltage to column conductor 36 and by selecting the appropriate source row conductor and drain row conductor combination, memory elements 23 and 24 can be individually addressed. In a similar fashion any other memory element in the array can be individually addressed.

Figure 3:
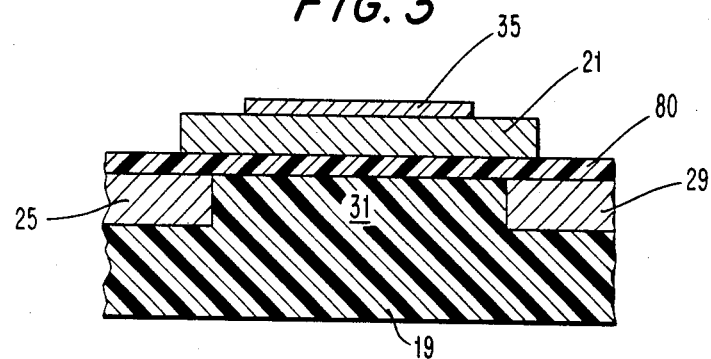
FIG. 3 is a sectional view of a memory location taken on line 3—3 of FIG. 2.
Figure 4:
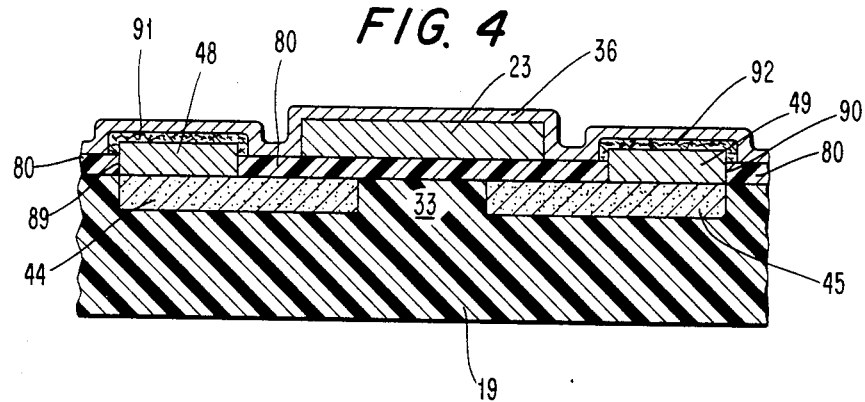
FIG. 4 is a sectional view of another memory location taken on the line 4—4 of FIG. 2.

The cross tie RAM of this invention can be made on a substrate. For example, with reference to FIG. 2 and the sectional drawings in FIGS. 3 and 4, cross tie RAM 20 (as well as cross tie RAM 70 of FIG. 5) includes substrate 19 and insulation layer 80 disposed upon substrate 19. The spaced binary memory elements 21, 22, 23, 24 are disposed upon insulation layer 80. The sources, drains, channels, and Hall electrodes are all formed in the substrate by conventional means, such as implanting or diffusing the appropriate dopants into the substrate. Typically, the substrate is made of silicon and the insulation layers are made of a silicon oxide or silicon nitride. The source row conductors, drain row conductors, and Hall electrode conductors are disposed upon insulation layer 80 and make electrical contact with the respective sources, drains, and Hall electrodes through contact holes in insulation layer 80. For example, as illustrated in FIG. 4, Hall electrode conductors 48 and 49 are connected to Hall electrodes 44 and 45, respectively, via contact holes 89 and 90. In FIG. 2, the locations of the contact holes for the source row conductors are designated 81, 82; for the drain row conductors as 83, 84; and for the Hall electrode conductors as 85–92. Additionally, the column conductors are insulated from the source, drain, and Hall electrode conductors. For example, in FIG. 4, column conductor 36 is insulated by insulation 91 and 92 from Hall electrode conductors 48 and 49.

To write a data bit into a memory element of RAM 20, the selected voltage across the appropriate source row conductor and drain row conductor combination is a WRITE voltage. The WRITE voltage is of a predetermined magnitude and polarity for creating a write current of magnitude and direction in the channel under the addressed memory element sufficient to change the binary memory state of that addressed memory element. For example, if it is desired that a logic state "1" be written into memory element 22, that memory element is addressed as discussed above and the WRITE voltage is applied across source row conductor 37 and drain row conductor 52 which creates a write current in channel 32 while that channel is in its conductive state. The write current in channel 32 under addressed memory element 22 produces a magnetic field of sufficient magnitude and proper orientation to change the binary memory state of address memory element 22 to indicate logic state "1". Following the convention used above in discussing the related cross tie RAMs, the write current will create a cross tie in addressed memory element 22 to represent logic state "1". If a logic "0" is to be written into the addressed memory element, then the write current will be of sufficient magnitude and direction to annihilate a cross tie in the addressed memory state. A typical write current will be in the range of 5 to 20 milliamps and depends on design parameters such as the shape of the memory element and the thickness of the thin film. Of course, as discussed above, data bits may be represented by any number of well known stable magnetic memory states in the addressed memory element.

To read a data bit out of an addressed memory element in the cross tie RAM of this invention, the selected voltage applied across the appropriate source row conductor and drain row conductor is a READ voltage at times when a data bit is to be read from the addressed memory element. The READ voltage creates a read current in the channel under the addressed memory element. That read current is insufficient to change the binary memory state of the addressed memory element (that is, less than the write current) yet sufficient to generate a Hall voltage in the channel under the addressed memory element when that memory element is in a specific one of its binary memory states. For example, if a Bloch line is present in the addressed memory element, that Bloch line will create an out-of-plane flux which will deflect the moving carriers in the channel under the addressed memory element. The effect of magnetic flux and moving carriers will result in a Hall voltage. Without the presence of the Bloch line, the Hall voltage will be absent or at least insignificant to be effectively absent. Conventional circuitry well within the skill of a person of ordinary skill in the art can be used to generate the appropriate WRITE and READ voltages. That circuitry is illustrated in block diagrammatic form as part of address, write and read modules 53 in FIG. 2.

To complete the reading out of a data bit in the addressed memory element, means are provided in cross tie RAM 20 for sensing the presence and absence of a generated Hall voltage in the channel under the addressed memory element. That sensing determines the binary memory state of the addressed memory element being read. In FIG. 2, the sensing means includes Hall electrodes adjacent to the channel under each memory element of the array and appropriate Hall electrode conductors connected to each Hall electrode. Specifically, in column $m_1$, Hall electrodes 40, 41 are adjacent to channel 31 under memory element 21 and are connected to Hall electrode conductors 48 and 49, respectively. Similarly, Hall electrodes 42, 43 are associated with channel 32 of memory element 22 and are connected to Hall electrode conductors 50 and 51, respectively. In column $m_2$, Hall electrodes 44, 45 are associated with channel 33 of memory element 23 and are connected to Hall electrode conductors 48 and 49, respectively; and Hall electrodes 46, 47 are adjacent to channel 34 of memory element 24 and are connected to Hall electrode conductors 50 and 51, respectively.

The position of the Hall electrodes, the length to width ratio of the channel, the dopant density and distribution, and the thickness of memory elements are designed to optimize the operation of the sensing of the Hall voltage. Conventional sensing technology, such as the use of sense amplifiers, can be used to detect the presence or effective absence of a generated Hall voltage. In FIG. 2, the Hall voltage sensing circuitry is illustrated in block diagrammatic form as Hall voltage detector 54.

As apparent from the above description, cross tie RAM 20 in FIG. 2 provides the important advantage of writing in and reading out data by utilizing current that flows under only the one memory element that is being addressed. This advantage overcomes the disadvantages of the cross tie RAMs discussed above and provides a cross tie RAM which is less susceptible to bit error production Additionally, the cross tie RAM invention allows for the use of a large current to write a data bit into an addressed memory element without affecting other memory elements. Therefore, the operating and design margins for the cross tie RAM can be made much greater.

In the embodiment illustrated in FIG. 2, a source row conductor is connected to the sources under memory elements in two adjacent rows. As shown, source row conductor 37 is connected to sources 25 and 27 in row $n_1$ and sources 26 and 28 in row $n_2$. Various other row conductor configurations can be used. For example, the drains of each transistor in two adjacent rows could be connected in common instead of the sources. Alternatively, two separate row conductors could be used for each row of memory elements, one for the sources and one for the drains.

Figure 5:
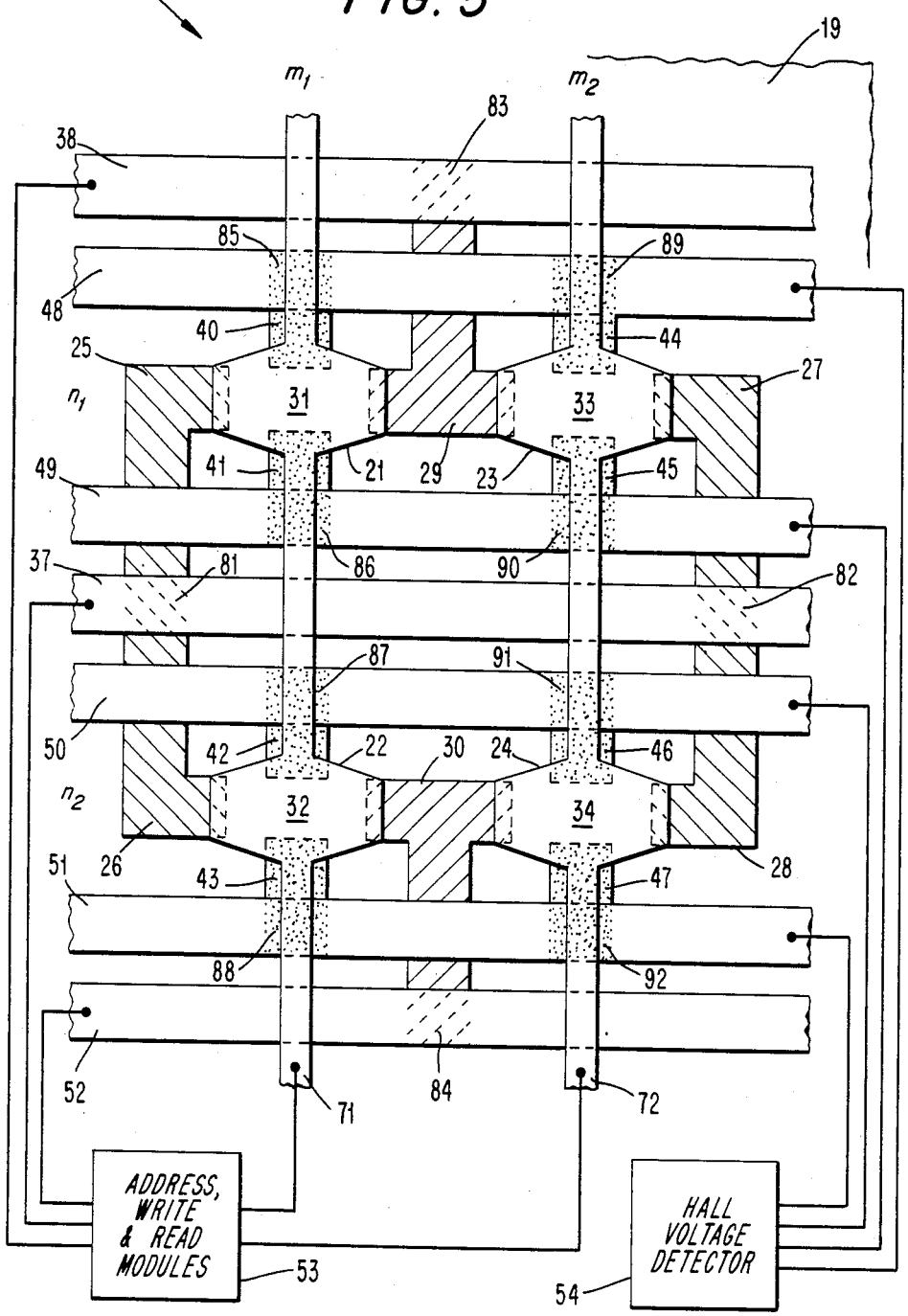
FIG. 5 is an enlarged diagrammatic view of a portion of a cross tie random access memory according to a second preferred embodiment of the invention.

In the preferred embodiment illustrated in FIG. 2, cross tie RAM 20 require overlying column conductors 35, 36, for example. In FIG. 5 a second preferred embodiment of the present invention is illustrated. By connecting the thin film memory elements in a column with thin film magneto-resistive material, column conductors 35, 36 can be eliminated. Cross tie RAM 70 is identical to cross tie RAM 20 of FIG. 2 except that continuous thin film strips 71, 72, which include spaced memory elements 21, 22 and 23, 24, respectively, serve as Column conductors 35, 36.

The operation of the present invention is apparent from the above description; however, the following is provided as a summary of the operation of cross tie RAMs 20 and 70. As with conventional RAMs, process circuitry of the memory system determines that a data bit, either logic "0" or "1", should be placed in a specific memory element. That determination selects the column conductor that is to be provided with an ON voltage and the source row conductor and drain row conductor that are to be energized. For example, if memory element 22 is to be the addressed memory element, an ON voltage is applied to column conductor 35 rendering channel 32 of the transistor conductive, and source conductor 37 and drain row conductor 52 are selected. The appropriate WRITE voltage is applied across row conductors 37 and 52 to create a write current in channel 32 of sufficient magnitude and appropriate direction to create a cross tie or to annihilate one, for example. That write current flows only through the single addressed memory element.

To read the addressed memory element, it is necessary only to present a READ voltage across row conductors 37 and 39 to generate the read current in channel 32 under addressed memory element 22. Depending on the stable magnetic state of addressed memory element 22, a Hall voltage will either be generated or will be effectively absent. Presence or effective absence of the Hall voltage is detected by Hall electrodes 42, 43 under address memory element 22, which voltage is sent to conventional detectors via Hall electrodes 50 and 51. As with the write current, the read current flows only under the channel of the single addressed memory element.

It will be apparent to those skilled in the art that various modifications and variations can be made in the thin film magnetic cross tie random access memory of the present invention without departing from the scope or spirit of the invention. Thus, it is intended that the present invention covers the modifications and variations of this invention provided they come within the scope of the appended claims and their equivalents.

What is claimed:

1. A cross tie random access memory comprising: spaced binary memory elements of thin film magneto-resistive material;
    a source, drain, and channel under each memory element forming a transistor with the memory element acting as the gate of the transistor;
    means for addressing selected ones of the memory elements;
    means for applying a WRITE voltage across the source and the drain under an addressed one of the elements to create a write current of magnitude and direction in the channel under the addressed memory element sufficient to change the binary memory state of the addressed memory element;
    means for applying a READ voltage across the source and the drain under the addressed memory element to create a read current in the channel under the addressed memory element insufficient to change the memory state of the addressed memory element and sufficient to generate a Hall voltage in the channel under the addressed memory element at times when that element is in one of its binary memory states; and
    means for sensing the presence and absence of a generated Hall voltage in the channel under the addressed memory element to determine the binary memory state of that element.

2. The cross tie random access memory of claim 1 wherein the transistor is an enhancement type MOSFET.

3. A cross tie random access memory comprising: spaced binary memory elements, arranged in an array of rows and columns, for storing data bits, each memory element being a thin film of magneto-resistive material;

a source, drain, and channel under each memory element forming a transistor with the memory element acting as the gate of the transistor;

a column conductor operatively connected to each memory element in a column;

a row conductor operatively connected to each of the sources under the memory elements in a row;

a row conductor operatively connected to each of the drains under the memory elements in a row;

means for individually addressing each of the memory elements including means for applying an ON voltage to the column conductor in which the addressed memory element is located sufficient to place the channel under the addressed memory element in its conductive state and means for applying a selected voltage across the source row conductor and the drain row conductor of the row in which the addressed memory element is located, the selected voltage being a WRITE voltage, at times when a data bit is to be written into the addressed memory element, for creating a write current of magnitude and direction in the channel under the addressed memory element sufficient to change the binary memory state of the addressed memory element, and being a READ voltage, at times when a data bit is to be read from the addressed memory element, for creating a read current in the channel under the addressed memory element insufficient to change the binary memory state of the addressed memory element and sufficient to generate a Hall voltage in the channel under the addressed memory element at times when that element is in one of its binary memory states; and means for sensing the presence and absence of a generated Hall voltage in the channel under the addressed memory element to determine the binary memory state of the addressed memory element being read.

4. The cross tie random access of claim 3 wherein the column conductor is comprised of magneto-resistive material integrally connecting the spaced memory elements of the column.

5. The cross tie random access memory of claim 3 wherein the transistor is an enhancement type MOSFET.

6. The cross tie random access memory of claim 3 wherein said sensing means includes Hall electrodes adjacent to the channel under the addressed memory element and a Hall electrode conductor connected to each Hall electrode.

7. The cross tie random access memory of claim 3 further including a substrate and an insulation layer disposed upon the substrate wherein the spaced binary memory elements are disposed upon the insulation layer, the sources, drains, channels, and Hall electrodes are in the substrate, the source row conductors, drain row conductors, and Hall electrode conductors are disposed upon the insulation layer and make electrical contact with the respective sources, drains, and Hall electrodes through contact holes in the insulation layer, and the column conductors are insulated from the source, drain, and Hall electrode conductors.

8. A cross tie random access memory comprising:

spaced binary memory elements, arranged in an array of rows and columns, for storing data bits, each memory element being a thin film of magneto-resistive material;

a source, drain, and channel under each memory element forming a transistor with the memory element acting as the gate of the transistor;

a column conductor operatively connected to each memory element in a column;

a row conductor operatively connected to each of the sources under the memory elements in a row, the same row conductor being operatively connected to memory elements positioned in adjacent columns and lying in the same row;

a row conductor operatively connected to each of the drains under the memory elements in a row;

means for individually addressing each of the memory elements including means for applying an ON voltage to the column conductor in which the addressed memory element is located sufficient to place the channel under the addressed memory element in its conductive state and means for applying a selected voltage across the source row conductor and the drain row conductor of the row in which the addressed memory element is located, the selected voltage being a WRITE voltage, at times when a data bit is to be written into the addressed memory element, for creating a write current of magnitude and direction in the channel under the addressed memory element sufficient to change the binary memory state of the addressed memory element, and being a READ voltage, at times when a data bit is to be read from the addressed memory element, for creating a read current in the channel under the addressed memory element insufficient to change the binary memory state of the addressed memory element and sufficient to generate a Hall voltage in the channel under the addressed memory element at times when that element is in one of its binary memory states; and means for sensing the presence and absence of a generated Hall voltage in the channel under the addressed memory element to determine the binary memory state of the addressed memory element being read, said means including Hall electrodes adjacent to the channel under the addressed memory element and a Hall electrode conductor connected to each Hall electrode.

* * * * *